United States Patent
Takagi et al.

(10) Patent No.: US 7,248,461 B2
(45) Date of Patent: Jul. 24, 2007

(54) CONDUCTING POLYMER COMPOSITE AND SOLID ELECTROLYTIC CAPACITOR USING THE SAME

(75) Inventors: Seiji Takagi, Moriguchi (JP); Ayumi Kochi, Moriguchi (JP); Kenji Akami, Hirakata (JP); Chiharu Hayashi, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 58 days.

(21) Appl. No.: 11/073,699

(22) Filed: Mar. 8, 2005

(65) Prior Publication Data
US 2005/0212094 A1 Sep. 29, 2005

(30) Foreign Application Priority Data
Mar. 29, 2004 (JP) .............................. 2004-095158

(51) Int. Cl.
*H01G 9/00* (2006.01)
(52) U.S. Cl. .................. 361/523; 361/525; 361/528; 361/530; 361/516; 361/519; 29/25.03
(58) Field of Classification Search ........ 361/523–534, 361/502–504, 516–519; 252/62.2; 29/25.03
See application file for complete search history.

(56) References Cited

U.S. PATENT DOCUMENTS

| | | | | |
|---|---|---|---|---|
| 4,858,078 A | * | 8/1989 | Morimoto et al. | 361/527 |
| 5,130,886 A | * | 7/1992 | Kishimoto et al. | 361/525 |
| 5,714,084 A | * | 2/1998 | Fujita et al. | 252/73 |
| 6,218,017 B1 | * | 4/2001 | Yamashita et al. | 428/424.2 |
| 6,288,890 B1 | * | 9/2001 | Saito et al. | 361/523 |
| 6,690,573 B2 | * | 2/2004 | Honda et al. | 361/509 |
| 6,839,222 B2 | * | 1/2005 | Takaoka et al. | 361/512 |
| 6,987,663 B2 | * | 1/2006 | Merker et al. | 361/523 |
| 6,999,303 B2 | * | 2/2006 | Hasegawa | 316/523 |
| 7,004,983 B2 | * | 2/2006 | Honda et al. | 29/25.03 |

FOREIGN PATENT DOCUMENTS

| | | |
|---|---|---|
| JP | 11-016783 | 1/1999 |
| JP | 2003-158043 | 5/2003 |

* cited by examiner

*Primary Examiner*—Nguyen T. Ha
(74) *Attorney, Agent, or Firm*—Wenderoth, Lind & Ponack, L.L.P.

(57) ABSTRACT

A conducting polymer composite is made by compounding a conducting polymer and an ionic polymer so as to achieve good conductivity. A high resistance material generated also has a high withstand voltage. A solid electrolytic capacitor using this conducting polymer composite as its solid electrolytic layer achieves low ESR and high withstand voltage.

9 Claims, 3 Drawing Sheets

CONDUCTING POLYMER COMPOSITE AND SOLID ELECTROLYTIC CAPACITOR USING THE SAME

FIELD OF THE INVENTION

The present invention relates to conducting polymer composites and solid electrolytic capacitors using the same used in various electronic products.

BACKGROUND OF THE INVENTION

Conducting polymers are increasingly being used in diverse fields. For example, in the field of electronic products, conducting polymers are typically used as antistatic films and conductive materials for organic transistors. With respect to commercialization, conducting polymers are extensively used as the solid electrolytic layer in solid electrolytic capacitors (SECs). These SECs are often used, in particular, in power circuits and CPU peripherals of personal computers, since SECs are smaller and have lower equivalent series resistance (ESR) at high frequencies.

One of the electrical characteristics of this SEC is withstand voltage, and this withstand voltage depends on the thickness of the dielectric film. In an aluminum SEC, for example, the dielectric film is formed by anodization, and thus the dielectric film becomes thicker in proportion to the anodization voltage. Accordingly, a higher anodization voltage results in a thicker dielectric film, and in turn a higher withstand voltage.

A basic structure of a conventional SEC as described above includes an anode made of a valve metal, the dielectric film formed on this valve metal and a solid electrolytic layer made of a conducting polymer formed on this dielectric film. In general, conducting polymer is used in unmodified form. Japanese Patent Laid-open Application No. 2003-158043 discloses an SEC with this structure.

In other cases, a conducting polymer is used with resin for the purpose of preventing any increase in leakage current resulting from mechanical stress sustained during assembly and thermal stress during packaging or mounting, and reducing shorting. This type of SEC is disclosed in Japanese Patent Laid-open Application No. H11-16783.

In the above conventional structure, however, it is also known that any leakage current in the SEC makes its solid electrolyte a high resistance material (HRM) due to the heat it generates. The HRM produced has a low withstand voltage, and thus the SEC becomes shorted in some cases. In particular, shorting is a serious problem in circuits running at high rated voltages.

In addition, the leakage current characteristic worsens if this conducting polymer is used as the solid electrolytic layer in an SEC.

SUMMARY OF THE INVENTION

The present invention offers a conducting polymer composite in which a conducting polymer and ionic polymer are compounded. This conducting polymer composite has good conductivity and its high resistance material produced also has a high withstand voltage.

Still more, a solid electrolytic capacitor using this conducting polymer composite as its solid electrolytic layer demonstrates lower ESR and also achieves a high withstand voltage.

DETAILED DESCRIPTION OF PREFERRED EMBODIMENTS

Figure 1:
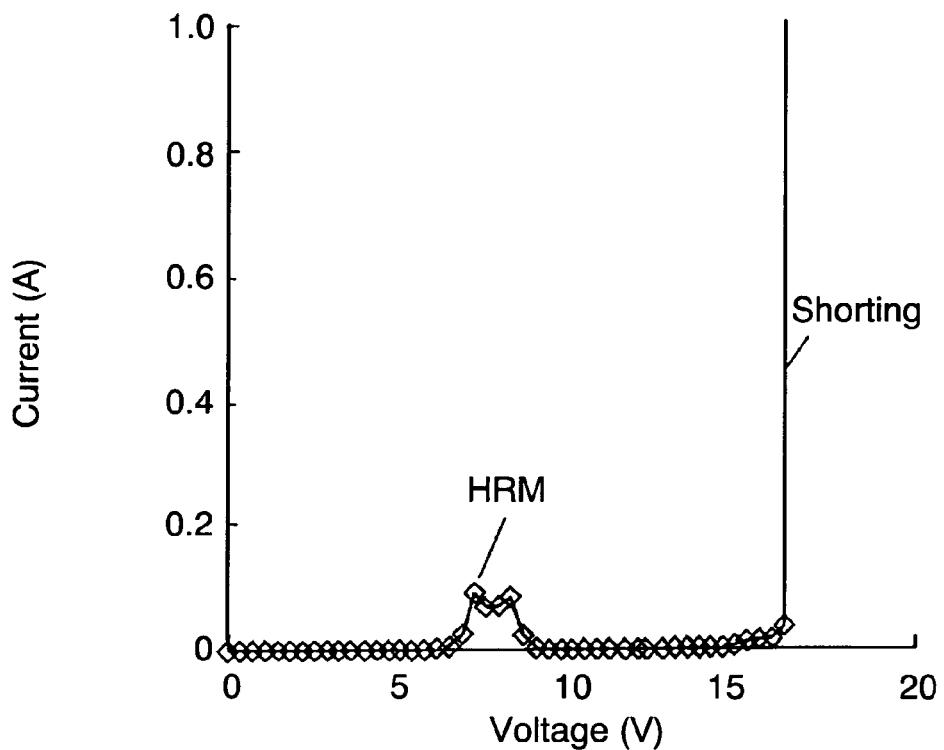
FIG. 1 is a chart illustrating the voltage-current characteristic in a withstand voltage test of a conducting polymer composite film in accordance with a first exemplary embodiment of the present invention.

Exemplary embodiments of the present invention are described next with reference to drawings. The drawings are schematic views and thus do not accurately indicate positional relations.

A conducting polymer composite of the present invention refers to a composite of a conducting polymer and an ionic polymer.

First Exemplary Embodiment

The conducting polymer composite of the present invention and a solid electrolytic capacitor (SEC) using this conducting polymer composite are described in a first exemplary embodiment of the present invention.

The conducting polymer used in SECs is generally formed of pyrrole, thiophene, or their derivatives using chemical polymerization through an oxidizing reaction by an oxidant, or electrolytic polymerization through an electrochemical reaction. In the case of chemical polymerization, a film of conducting polymer for evaluation is difficult to obtain because the reaction can occur anywhere in the solution.

In the case of electrolytic polymerization, on the other hand, polymerization occurs only on an electrode in the solution. A conducting polymer formed on the electrode allows the characteristics of the resultant conducting polymer film to be evaluated. Accordingly, in this exemplary embodiment, a conducting polymer film is made using electrolytic polymerization for evaluation.

To prepare a conducting polymer composite of the present invention, it is necessary to combine a conducting polymer and an ionic polymer. The ionic polymer used for composition refers to a polymer which dissociates into ions in the solution. For example, when polyacrylic acid is dissolved in pure water, polyacrylic acid dissociates into high-charge ions with enormous charge and numerous counter ions with a small opposite charge.

Ionic polymers having the above property include homopolymer or copolymers of polyacrylic acid and polymaleic acid.

The above ionic polymer is compounded with a conducting polymer in the next way. When pyrrole is polymerized to make polypyrrole, which is the polymer chain of the conducting polymer, the ionic polymer is compounded in the solution.

How polymers are compounded is described next. There are three types of composite. First uses chemical bonding, in which the ionic polymer acts as a dopant of the conducting polymer; second is physical entangling of polymer chains; and third is a combined state of the first two.

When current is applied to a conventional conducting polymer, the conducting polymer becomes a high resistance material (HRM) due to de-doping caused by heat generation or oxidization. The withstand voltage of an SEC using this conventional conducting polymer as a solid electrolyte layer is not very high.

On the other hand, the use of a conducting polymer composite of the present invention, in which a conducting polymer and an ionic polymer are compounded, increases the withstand voltage of HRM. Still more, the use of this conducting polymer composite as the solid electrolyte layer of the SEC results in increased withstand voltage without loss of the ESR's characteristics. Although there are two types of composite, i.e., ionic polymer acting as dopant, and physical mixture, the same effect is achievable with both types.

The use of ionic polymer also facilitates compounding with conducting polymer chain because the polymer in an ionic polymer acts as a dopant for the conducting polymer.

In the case of electrolytic polymerization, a composite is even more easily achieved because the ionic polymer is attracted to the electrode by its charge.

Still more, a copolymer of the above ionic polymer and one of polyolefin, polyether and polyvinyl alcohol (PVA) enhances adherence of the conducting polymer composite film and improves the withstand voltage of HRM of the conducting polymer composite.

If this conducting polymer composite is used in the SEC, the withstand voltage of the capacitance element improves further.

Next, a method of preparing the conducting polymer composite of the present invention is described.

First, 98 ml of water is poured into each container, and 1.6 g of sodium alkyl-naphthalenesulphonate (SNS) is dissolved in the water.

An appropriate amount of polymaleic acid, polyacrylic acid or copolymer of maleic acid and acrylic acid is then added and dissolved in each solution with the solid content being 1 wt %. Then, 1.6 g of ethanol and 2.68 g of pyrrole are added and dissolved (Samples 1 to 3).

In addition, an appropriate amount of polyolefin, polyether or PVA is dissolved in the solutions of Sample 1 as polymer (polymer A) making a copolymer with ionic polymer with solid content of the polymer A being 1 wt % (Samples 4 to 6).

In the samples, SNS is a dopant for conducting polymers, and conductivity is manifested by charge transfer between the conducting polymer and the dopant. In the first exemplary embodiment, sodium salt is used as the dopant, but alkylnaphthalene sulfonic acid is also applicable. Still more, aromatic sulfonic acids, aliphatic sulfonic acids and their derivatives can be used instead of SNS. Aromatics which possess skeletons, such as benzene, naphthalene, anthracene, pyrene, biphenyl, terphenyl, furan, pyrrole, thiophene and pyridine are generally used as dopant. Other than those listed here, aromatic compounds having p electrons that satisfy Hueckel's rule are also applicable.

In the dopant, the sulfonic acid group does not have to be limited to a single group. The dopant can also be disulfonic acid, which has two sulfonic acid groups, and its derivatives; trisulfonic acid, which has three sulfonic acid groups, and its derivatives; or tetrasulfonic acid, which has four sulfonic acid groups, and its derivatives. If these types of compounds with multiple sulfonic acid groups are used as the dopant, conducting polymer chains create a crosslinked structure, depending on the dopant. This improves the mechanical strength. In addition, doping at multiple points hinders de-doping, resulting in improved heat resistance.

Moreover, a substitute other than a sulfonic acid group can be present in the aromatic ring. For example, if a sterically bulky substitute is present, de-doping is suppressed. Accordingly, the heat resistance is expected to improve. If a substitute allowing hydrogen bonding is present, de-doping can be suppressed by the presence of hydrogen bonds. If a substitute has a reactive site, such as double bond or epoxy group, the strength of the conducting polymer film can be improved by making the reactive sites react or crosslink using another compound.

In this exemplary embodiment, pyrrole is used as the monomer of the conducting polymer. However, pyrrole derivatives or thiophene and its derivatives can also be used as monomers. The use of these compounds allows the addition of characteristics such as high conductivity, high heat resistance, high mechanical strength and solubility.

Ethanol is added to improve the solubility of pyrrole.

Next, two nickel plates are placed, without contacting each other, in the solutions as electrodes. Electrolytic polymerization takes place on applying a 3.0 V voltage between the two nickel plates for 30 minutes. In this way, the conducting polymer composite film is formed on the anode nickel plate.

This conducting polymer composite film is then peeled from the nickel plate after cleaning and drying and used as a sample for measurement.

While making the samples for measurement, it is necessary to ensure that the two nickel plates do not come into contact. The nickel plate is 30 μm thick and 7.5 mm wide. Nickel is exposed on the surface only for 70 mm, and the remaining portion is insulated by tape such that the conducting polymer composite is formed only on a portion where nickel is exposed in the nickel plate.

In this exemplary embodiment, electrolytic polymerization is achieved by applying 3.0 V. It is apparent that other voltages are applicable. However, excessively high voltage would result in rapid electrolysis of water, a side reaction that would impede the production of a homogenous conducting polymer film. On the other hand, excessively low voltage would result in no electrolytic polymerization. Accordingly, the optimal voltage is between 1 V and 5 V, although it also depends on the apparatus used. In fact, since the actual reaction depends on the electric potential and not the voltage, the reaction is preferably controlled by electrode potential for reasons of accuracy. To enable this, a silver-silver chloride electrode can be used as the reference electrode, with the potential for the anode preferably set between 0.6 V and 2 V.

Still more, the voltage is controlled in electrolytic polymerization in this exemplary embodiment. However, current control is also applicable. If electrolytic polymerization is achieved by controlling the current, the mol number of the conducting polymer created can easily be made equal. This enables the manufacture of a highly homogeneous conducting polymer composite film.

Still more, electrolytic polymerization takes place at room temperature in this exemplary embodiment. However, lower temperatures or high temperatures are also applicable. Low-temperature polymerization is advantageous for suppressing volatilization of the solution so as to extend the life of the solution. However, it is necessary to ensure that the temperature is maintained above the melting point of the solution. Otherwise, the solution will freeze, and unstable or no polymerization will take place. High-temperature polymerization accelerates the volatilization of the solution but the reaction also proceeds faster. If water is used as the solvent, as in this exemplary embodiment, the temperature is preferably between 0 and 50° C. If a solvent such as THF for organic synthesis is used, the solution can be cooled down to about −100° C.

Cleaning after electrolytic polymerization is preferably conducted thoroughly. If cleaning is insufficient, solutes such as unreacted monomer and dopant remain attached to the created conducting polymer composite.

This attached solute contaminates the surface and has a detrimental effect on measurement of conductivity in some cases. In addition, the attached solute would also accelerate degradation of the conducting polymer composite.

The conducting polymer composite needs to be dried within a temperature range in which no decomposition or de-doping of conducting polymer composite occurs. Low temperatures are preferable, but drying is preferably conducted at ambient temperatures of between room temperature and 200° C., taking productivity into account.

Next, for comparison, 1.6 g of SNS is dissolved in 98 ml of water. Then, 1.6 g of ethanol and 2.68 g of pyrrole are added and dissolved. In this solution, two nickel plates are placed as electrodes, without contacting each other, and 3.0 V voltage is applied between these two nickel plates for 30 minutes. After cleaning and drying the anode nickel plate, the film is peeled off as a sample for measurement (Comparison 1).

The conductivities of these samples created using the above methods are measured via the 4-pin probe method using a Loresta GP (Dia Instruments Co., Ltd.).

Withstand voltage is measured using a DC power supply, which allows the control of voltage, and ammeter. Voltage is increased by 0.2 V per second from 0 V to 100 V, and the withstand voltage of the samples is determined when a current of 1 A is passing.

Table 1 shows the measurement results for withstand voltage of HRM films in which the conducting polymer has high resistance in Samples 1 to 6 of the exemplary embodiment and Comparison 1 which is a sample of the prior art.

It is apparent from Table 1 that the conducting polymer composite of the present invention shows better withstand voltage.

TABLE 1

| | Conducting polymer | Ionic polymer | Polymer A | Withstand voltage A (V) |
|---|---|---|---|---|
| Sample 1 | Polypyrrole | Polymaleic acid | | 14 |
| Sample 2 | Polypyrrole | Polyacrlic acid | | 14 |
| Sample 3 | Polypyrrole | Polymer B | | 18 |
| Sample 4 | Polypyrrole | Polymaleic acid | Polyolefin | 19 |
| Sample 5 | Polypyrrole | Polymaleic acid | Polyether | 17 |
| Sample 6 | Polypyrrole | Polymaleic acid | PVA | 21 |
| Comparison 1 | Polypyrrole | | | 10 |

Polymer A: Polymer making copolymer with ionic polymer
Polymer B: Copolymer of acrylic acid and maleic acid
Withstand voltage A: Withstand voltage of the HRM made of conducting polymer or conducting polymer composite Next, FIG. 1 shows changes in the characteristic in the withstand voltage test of the conducting polymer composite having the composition of Sample 5.

Results shown in FIG. 1 reveal that heat is generated by excessive current passing through the conducting polymer composite film when excessive current is applied. This causes de-doping of the conducting polymer composite film, making it an HRM. If the voltage is further increased, shorting occurs. This voltage causing shorting is defined as the withstand voltage.

Figure 2:
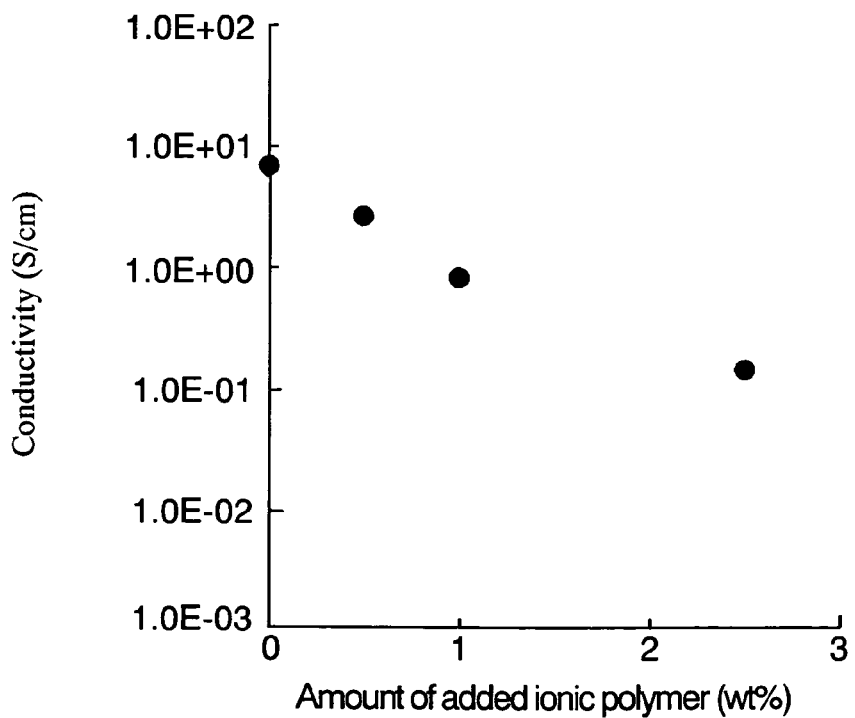
FIG. 2 is a chart illustrating the relation between an amount of added ionic polymer and conductivity of the conducting polymer composite in accordance with the first exemplary embodiment of the present invention.
Figure 3:
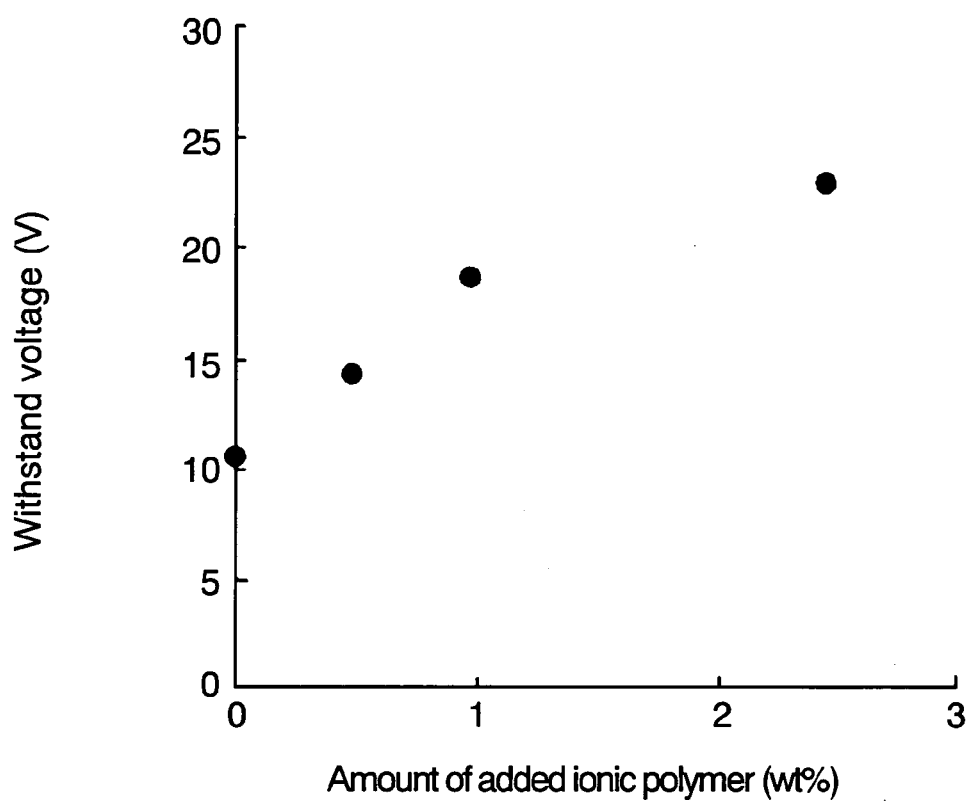
FIG. 3 is a chart illustrating the relation between an amount of added ionic polymer and withstand voltage of the conducting polymer composite in accordance with the first exemplary embodiment of the present invention.

Next, FIG. 2 shows changes in conductivity when the amount of added copolymer of olefin and maleic acid, which are constituents of ionic polymer, are changed, and FIG. 3 shows changes in withstand voltage.

FIGS. 2 and 3 reveal that the use of the conducting polymer composite in the exemplary embodiment improves withstand voltage without significantly reducing conductivity. If the amount of added ionic polymer becomes too large, the reaction for producing the conducting polymer composite film becomes slow, decreasing production efficiency. If the amount of ionic polymer exceeds 5%, conductivity drops sharply.

The same effect is achievable by the use of compounds such as polybutadiene, polyisoprene, polyisobutylene, polystyrene, polyacrylonitorile, polyurethane, polyvinyl acetate, polymethyl acrylate, polyethyl methacrylate, polymethyl methacrylate, polyester, polycarbonate, polyethersulfone, polyamide, polyimide, polyvinylidene fluoride, polytetrafluoroethylene, cellulose, polysiloxane and polyacetal as polymer A.

Second Exemplary Embodiment

A conducting polymer composite in a second exemplary embodiment of the present invention, and an SEC using this conducting polymer composite are described next with reference to drawings.

Figure 4:
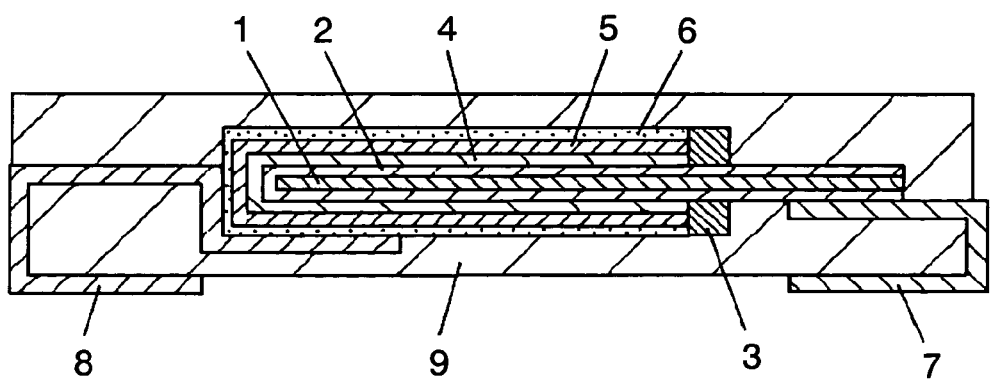
FIG. 4 is a schematic sectional view of SEC in accordance with a second exemplary embodiment of the present invention.

FIG. 4 is a schematic sectional view of SEC in the second exemplary embodiment of the present invention.

In FIG. 4, valve metal 1 is typically tantalum, niobium or aluminum. Dielectric film 2 is typically formed by anodization or sintering after molding the valve metal powder.

Insulation layer 3 is formed using epoxy resin or silicone resin. This insulation layer 3 separates the anode and cathode so as to prevent shorting between the electrodes. Solid electrolytic layer 4 is formed on dielectric film 2. A composite of pyrrole, thiophene or their derivatives and an ionic polymer, i.e., conducting polymer composite, is used for this solid electrolytic layer 4. Solid electrolytic layer 4 is formed by chemical polymerization and electrolytic polymerization.

Carbon layer 5 is then formed on solid electrolytic layer 4. Silver paste layer 6 is formed on carbon layer 5. Anode 7 and cathode 8 with lead frame and casing 9 are then provided.

Next, the structure of the SEC of the present invention is detailed. In this exemplary embodiment, valve metal 1 is made of aluminum, and solid electrolytic layer 4 is made of polypyrrole compounded with ionic polymer. First, aluminum foil 100 μm thick and punched into a predetermined shape is etched. Next, anodization is applied via a solution of ammonium dihydrogen phosphate at 5 V to create dielectric film 2.

Insulation layer 3 is then formed, typically using silicone resin.

As for solid electrolytic layer 4, the ionic polymer and polypyrrole are compounded by chemically polymerization to make a conducting polymer composite, and a conducting polymer composite is further formed on this conducting polymer composite by electrolytic polymerization. A solution for electrolytic polymerization is prepared in the following way. First, 98 ml of water is poured into each container. Then, 1.6 g of SNS is dissolved. Next, a copolymer of olefin and maleic acid is added to the solutions until its solid content becomes, respectively, 0.5 wt %, 1.0 wt % or 2.5 wt %. Lastly, 1.6 g of ethanol and 2.68 g of pyrrole are added and dissolved in each solution.

Carbon layer 5 and silver paste layer 6 are applied and formed, using carbon paste and silver paste, on solid electrolytic layer 4 formed by the above chemical polymerization and electrolytic polymerization. This SEC element is connected to lead frames, which are anode 7 and cathode 8, typically by welding. Then, casing 9 is formed by molding epoxy resin to complete the SEC. The SEC is then aged to create samples of the SEC of the present invention for evaluation (Samples 7 to 9).

For comparison, a solution of the conventional conducting polymer using pyrrole is prepared, and the SEC is made using the same manufacturing method as for the present invention (Comparison 2).

Table 2 shows the characteristics of the conducting polymer composite of the present invention (Samples 7-9) and the conducting polymer of Comparison 2 of the prior art.

Figure 5:
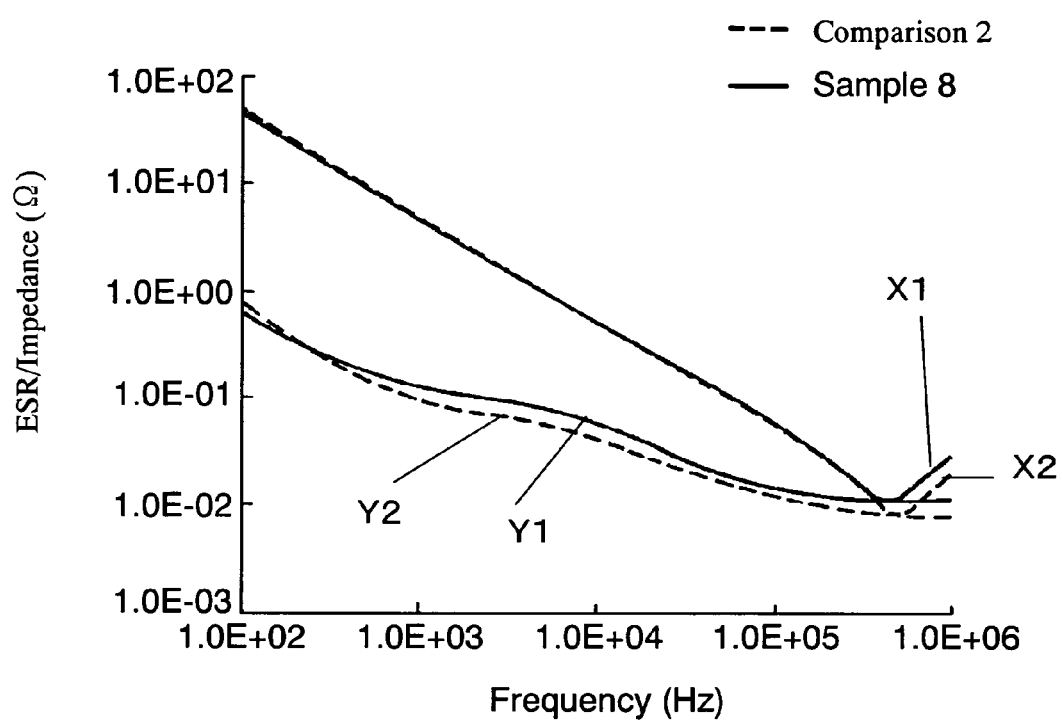
FIG. 5 is a chart illustrating the characteristic of SEC in accordance with the second exemplary embodiment of the present invention.

FIG. 5 shows the ESR characteristic and impedance frequency characteristic of SECs which use these samples of conducting polymer for solid electrolytic layer 4.

In FIG. 5, the horizontal axis is frequency, and the vertical axis is ESR and impedance. Lines marked X1 and Y1 show the ESR and impedance of Sample 8, and lines marked X2 and Y2 show the ESR and impedance of Comparison 2.

TABLE 2

|  | Comparison 2 | Sample 7 | Sample 8 | Sample 9 |
| --- | --- | --- | --- | --- |
| Amount of added ionic polymer(wt %) | 0.0 | 0.5 | 1.0 | 2.5 |
| Capacity (µF) | 32 | 33 | 32 | 33 |
| ESR | 13 | 12 | 14 | 15 |
| Withstand voltage (V) | 7.6 | 10.6 | 13.2 | 15.3 |

The results shown in Table 2 and FIG. 5 reveal that SEC using the conducting polymer composite of the present invention as solid electrolytic layer 4 has better withstand voltage without loss of electrical characteristics.

In the second exemplary embodiment, the size of a portion leading out the capacity of capacitor element is 4 mm×3 mm of aluminum foil per face.

In the second exemplary embodiment, SNS is used as a dopant. However, aromatic sulfonic acid and its derivatives can also be used in the same way as in the first exemplary embodiment.

In addition, as in the first exemplary embodiment, the sulfonic acid group in the dopant does not have to be limited to a single group. The dopant can also be disulfonic acid, which has two sulfonic acid groups, and its derivatives; trisulfonic acid, which has three sulfonic acid groups, and its derivatives; or tetrasulfonic acid, which has four sulfonic acid groups, and its derivatives.

The use of these types of compounds with multiple sulfonic acid groups improves the reliability of the SEC against stress, and also enhances the heat resistance.

Still more, as in the first exemplary embodiment, a substitute other than a sulfonic acid group can be present in the aromatic ring. For example, if a sterically bulky substitute is present, de-doping is suppressed. Accordingly, the heat resistance of SEC is expected to improve. If a substitute allowing hydrogen bonding is present, the heat resistance can be further improved.

If a substitute has a reactive site, such as double bond or epoxy group, the conducting polymer composite can be obtained by making the reactive sites react or crosslink using another compound. Accordingly, SEC with high reliability can be provided by using this conducting polymer composite as solid electrolytic layer 4.

In this exemplary embodiment, copolymer of olefin and maleic acid is used as ionic polymer. However, the ionic polymer made of substances other than these is also applicable.

Still more, pyrrole is used as the monomer of the conducting polymer in this exemplary embodiment. However, pyrrole derivatives or thiophene and its derivatives can also be used as monomers.

The use of these compounds allows the addition of characteristics such as high conductivity, high heat resistance, high mechanical strength and solubility. Accordingly, the use of the above conducting polymer composite for solid electrolytic layer 4 can lower ESR and improve the heat resistance, which are important characteristics of SEC.

Still more, if the conducting polymer composite is mainly composed of a laminated film of polythiofen and its derivatives and poypyrrole and its derivatives, the SEC with good withstand voltage and heat resistance is achievable. Still more, if the conducting polymer composite is a laminated film of polythiofen and its derivatives and polypyrrole and its derivatives, a highly homogenous film and better heat resistance are achievable.

The second exemplary embodiment uses both chemical polymerization and electrolytic polymerization for forming solid electrolytic layer 4. However, solid electrolytic layer 4 can be formed just using either chemical polymerization or electrolytic polymerization. If only chemical polymerization is applied, a range of chemical compounds can readily be mixed into the reaction system, and thus solid electrolytic layer 4 with diverse characteristics is achievable. If only electrolytic polymerization is applied, compact solid electrolytic layer 4 with good conductivity is achievable because reactions occur consecutively on the electrode surface. Accordingly, electrolytic polymerization leads to lower ESR than chemical polymerization. However, a conductive layer needs to be formed on the surface of dielectric film 2 in the case of electrolytic polymerization, and thus the following methods are employed. For example, chemical polymerization; application of soluble conducting polymer or dispersed solution of conducting polymer powder; and formation of manganese dioxide used in solid electrolytic layer 4 of a conventional tantalum capacitor.

The conducting polymer composite of the present invention has good conductivity and its HRM shows a high withstand voltage. Accordingly, this conducting polymer composite is applicable to various electronic products. The SEC using this conducting polymer composite as its solid electrolytic layer would demonstrate good withstand voltage, making it suitable for use in power circuits in electronic products.

What is claimed is:

1. A conducting polymer composite in which an ionic polymer and a conducting polymer are compounded,
   said ionic polymer being a copolymer of one of polyacrylic acid or polymaleic acid with one of polyolefin, polyether or polyvinyl alcohol.

2. The conducting polymer composite as defined in claim 1, wherein a polymer chain of the conducting polymer is polypyrrole and its derivative.

3. The conducting polymer composite as defined in claim 1, wherein a polymer chain of the conducting polymer is polythiophene and its derivative.

4. The conducting polymer composite as defined in claim 1, wherein a the conducting polymer composite is formed at least by one of chemical polymerization and electrolytic polymerization.

5. A solid electrolytic capacitor comprising:
   an anode made at least of a valve metal;
   a dielectric film formed on the valve metal; and
   a solid electrolytic layer formed on the dielectric film;
   wherein the solid electrolytic layer is a conducting polymer composite of a conducting polymer and an ionic polymer,
   said ionic polymer being a copolymer of one of polyacrylic acid or polymaleic acid with one of polyolefin, polyether or polyvinyl alcohol.

6. The solid electrolytic capacitor as defined in claim 5, wherein a polymer chain of the conducting polymer is polypyrrole and its derivative.

7. The conducting polymer composite defined in claim 5, wherein a polymer chain of the conducting polymer is polythiophene and its derivative.

8. The solid electrolytic capacitor as defined in claim 5, wherein a polymer chain of the conducting polymer is a laminated film of:
   polythiophene and its derivative; and
   polypyrrole and its derivative.

9. The solid electrolytic capacitor as defined in claim 5, wherein the conducting polymer composite is formed at least by one of chemical polymerization and electrolytic polymerization.

* * * * *